United States Patent [19]

Furuhata

[11] 4,366,399

[45] Dec. 28, 1982

[54] FREQUENCY DISCRIMINATION CIRCUIT

[75] Inventor: Takashi Furuhata, Yokohama, Japan

[73] Assignee: Hitachi, Ltd., Tokyo, Japan

[21] Appl. No.: 221,324

[22] Filed: Dec. 29, 1980

[30] Foreign Application Priority Data

Dec. 26, 1979 [JP] Japan ............................... 54/168369

[51] Int. Cl.³ .......................... H03K 5/19; H03K 6/00; G11C 27/02
[52] U.S. Cl. .................................... 307/519; 328/140; 328/151; 328/185; 307/352; 307/522; 318/318
[58] Field of Search ....................... 307/519, 352, 522; 328/140, 151, 185; 318/317, 318

[56] References Cited

U.S. PATENT DOCUMENTS 3,778,638  12/1973  Garratt ................................. 328/140
3,867,647   2/1975  Callahan et al. ..................... 307/519
4,085,373   4/1978  McConnell ........................... 307/519

Primary Examiner—John S. Heyman
Attorney, Agent, or Firm—Antonelli, Terry & Wands

[57] ABSTRACT

A frequency discrimination circuit suitable for use in a speed control device is disclosed which comprises a single retriggerable monostable multivibrator for discriminating a period of an input pulse signal corresponding to a speed from a predetermined period, a gate for inhibiting the output of the multivibrator at least for a sampling period, and a trapezoidal wave generator for generating a trapezoidal wave when the output of the gate is absent, and a sample-and-hold circuit for sampling the trapezoidal wave by a sampling pulse synchronized with the input pulse signal and for holding a sampled value to generate a frequency discrimination output on the output side of the circuit. The provision of the retriggerable monostable multivibrator reduces undesirable variations the circuit operation due to the change in the ambient temperature, and prevents the generation of a false lock-in point.

6 Claims, 9 Drawing Figures

FREQUENCY DISCRIMINATION CIRCUIT

BACKGROUND OF THE INVENTION

The present invention relates, in general, to a frequency discrimination circuit, and more particularly, to a frequency discrimination circuit used for speed detection in a speed control device.

In an electric apparatus which includes a rotating body required to have a constant speed of revolution such as rotating heads and capstans of video tape recorders (VTRs) a so-called servo control system is generally employed in which the speed of revolution of the rotating body is detected and a motor for driving the rotating body is controlled by the detected speed signal so that a predetermined speed of revolution is maintained.

An example of the above-mentioned servo control system is shown in FIG. 1 of the accompanying drawings. Referring to FIG. 1, the speed of revolution of a rotating body 2, for example, the rotating head of VTR driven by a drive motor 1 is detected by a detector 3, which delivers a pulse signal A having a frequency proportional to the revolution speed of the rotating body 2. The pulse signal A is applied to a frequency discrimination circuit 4, which discriminates frequencies and delivers an error voltage E corresponding to a deviation of the frequency of the pulse signal A from a predetermined frequency, that is, a deviation of the actual speed of revolution from a predetermined one. The error voltage E is applied to a motor driving amplifier 5, the output of which is used to control the speed of revolution of the drive motor 1. Thus, the revolution speed of the rotating body 2 is maintained at a predetermined value.

As is apparent from the foregoing, in the servo control system, the control characteristic of the whole system is greatly affected by the performance of the frequency discrimination circuit 4. Accordingly, there have been proposed various types of frequency discrimination circuits, a typical one of which includes a plurality of monostable multivibrators (hereinafter referred to as "MMV"). An example of such a frequency discrimination circuit is shown in FIG. 2. In FIG. 2, reference numeral 101 designates an input terminal applied with the pulse signal A which is shown in FIG. 1 and indicates a speed of revolution, 102 an output terminal for feeding the error voltage E shown in FIG. 1 to the motor driving amplifier 5, 103 and 104 monostable multivibrators having time constants $\tau_1$ and $\tau_2$, respectively, 105 a trapezoidal wave generator, 106 a pulse shaper, and 107 a sample-and-hold circuit. The sum of the time constants $\tau_1$ and $\tau_2$ is used to determine a reference period.

Next, the operation of the frequency discrimination circuit shown in FIG. 2 will be explained using a waveform chart shown in FIG. 3. The pulse signal A from the input terminal 101 is applied to MMV 103 and the pulse shaper 106. MMV 103 is triggered at the leading edge of each input pulse A to generate a square wave signal B having a pulse width $\tau_1$. MMV 104 is triggered at trailing edges of the square wave signal B from MMV 103 to produce a square wave signal C having a pulse width $\tau_2$. At trailing edges of the square wave signal C from MMV 104 the trapezoidal wave generator 105 is triggered to deliver a trapezoidal wave signal D which has a constant inclination part of a period $\tau_0$, that is, a ramp characteristic. The signal D is applied as the sampled input to the sample-and-hold circuit 107.

The angle of inclination of the constant inclination part determines the frequency discrimination sensitivity. In more detail, when the angle of inclination is too large, the error voltage E takes only two levels, that is, high and low levels. Accordingly, the above-mentioned control system performs an undesired on-off control.

The pulse singal A applied to the pulse shaper 106 is shaped into a pulse signal P which is synchronized with leading edges of the pulse signal A and has a relatively narrow pulse width. The pulse signal P thus shaped is applied as the sampling input to the sample-and-hold circuit 107. The circuit 107 delivers the error voltage E, which holds during a sampling period a value sampled from the trapezoidal wave signal D by the pulse signal P, for the reasons described later. When a reference period corresponding to a predetermined target speed of revolution is given by $T_0 = \tau_1 + \tau_2 + \tau_0/2$, where $\tau_1$, $\tau_2$ and $\tau_0$ indicate the time constant of MMV 103, that of MMV 104 and the period of the constant inclination part of the trapezoidal wave signal D, respectively, and when the frequency of the pulse signal A is expressed by T, the error voltage E takes a voltage value $E_0$, which is equal to about one-half a maximum value of the trapezoidal wave signal D and indicates that the deviation is equal to zero, if $T = T_0$. Further, when the revolution speed of the rotating body 2 shown in FIG. 1 is reduced to less than the predetermined value, that is, $T > T_0$, the error voltage E becomes greater than the voltage $E_0$. While, when the revolution speed of the rotating body 2 is increased to more than the predetermined value, that is, $T < T_0$, the error voltage E becomes smaller than the voltage $E_0$. These changes in error voltage are shown as stepwide changes of the error voltage E relative to the voltage $E_0$ in FIG. 3.

The error voltage E is applied to the motor 1 through the motor driving amplifier 5 (as shown in FIG. 1). When the revolution speed of the rotating body 2 is reduced, the error voltage E becomes greater than the voltage $E_0$. Accordingly, the voltage applied to the motor 1 is increased so that the revolution speed of the rotating body 2 is enhanced. On the other hand, when the revolution speed of the rotating body 2 is increased, the error voltage E becomes smaller than the voltage $E_0$. Thus, the voltage applied to the motor 1 is decreased so that the revolution speed of the rotating body 2 is lowered. In other words, the revolution speed of the rotating body 2 is controlled so as to be maintained at a predetermined value, at which the period T of the pulse signal A is equal to the reference period $T_0$ and the error voltage E is equal to the voltage $E_0$.

Since the above-mentioned conventional frequency discrimination circuit is relatively simple in construction and has satisfactory sensitivity and linearity with respect to frequency discrimination from a practical point of view, it has been widely employed.

In the above frequency discrimination circuit, however, a predetermined speed of revolution of the rotating body is set by those time constants $\tau_1$ and $\tau_2$ of MMV's 103 and 104 which are determined by fundamental and timing factors, and the time constants depend upon the temperature and the supply voltage. Accordingly, there is a problem that the revolution speed of the rotating body is deviated from the predetermined value due to variations in ambient temperature and in supply voltage.

Further, in the conventional frequency discrimination circuit shown in FIG. 2, the pulse signal A generates the error voltage E equal to the voltage $E_0$ at a plurality of periods on the basis of the characteristic of the circuit. Accordingly, when a servo system for controlling the speed of revolution of the rotating body is constructed using the conventional frequency discrimination circuit, there is a danger of the rotating body being locked in a stationary state at a plurality of speeds of revolution. In more detail, in the case where the revolution speed of the rotating body 2 is greatly increased for some causes and the period T of the pulse signal A is smaller than the time constant $\tau_1$ of MMV 103, as shown in FIG. 4, a so-called frequency dividing effect is generated by MMV 103, and input pulses applied to MMV 103 before the lapse of a delay time corresponding to the time constant $\tau_1$, that is, input pulses a shown in FIG. 4 do not trigger MMV 103. As a result of inhibiting the input pulses a, the repetition period of the trapezoidal wave signal D becomes much larger than tee period T of the pulse signal A. On the other hand, the pulse signal P for sampling the signal D has the same period as the pulse signal A, and there is little probability that the leading part (that is, the constant inclination part) of the trapezoidal wave signal D is sampled. Accordingly, a maximum value and a minimum value (equal to zero) of the signal D are alternately sampled to produce the error voltage E. A mean value of the error voltage thus sampled is equal the about one-half the maximum value of the signal D, that is, nearly equal to the voltage $E_0$. In other words, the servo control system is brought to a lock-in state also in this case. The pulse signal A produces the error voltage E equal to the voltage $E_0$ at different periods, and thus there is a danger that the revolution speed of the rotating body 2 is pulled in different values, that is, into false stable state of the control system.

It is to be noted that, since the driving motor 1 employed in the servo control system has an integration effect, the motor 1 is operated as if driven substantially by a mean value of the waveform E (error voltage E) shown in FIG. 4.

SUMMARY OF THE INVENTION

An object of the present invention is to provide a frequency discrimination circuit which can overcome the above-mentioned drawbacks of prior art, which can always exhibit a stable frequency discrimination characteristic without being affected by a change in ambient temperature and by variations in circuit operating voltage.

Another object of the invention is to provide a servo control circuit suitable for use in speed control devices, which servo control circuit includes a frequency discrimination circuit having simple circuit configuration and a stable frequency discrimination characteristic independent of environmental conditions, in order to improve speed control characteristics of the speed control devices and to enhance the reliability of the utilization devices.

A further object of the present invention is to provide a frequency discrimination circuit including monostable multivibrator means for controlling the revolution speed of a rotating body, which circuit has a stable frequency discrimination characteristic independently of an adverse effect of variations in ambient temperature and in supply voltage on the monostable multivibrator means, and brings the rotating body to a single stable state even if the speed of revolution of the rotating body is distributed over a wide range.

In order to attain these objects, according to the present invention, there is provided a frequency discrimination circuit in which only one monostable multivibrator (MMV) is employed to discriminate a period of an input pulse signal from a reference period, and it has a retriggerable MMV function to thereby prevent and deterioration of frequency discrimination characteristic due to variations in ambient temperature and in supply voltage. In other words, according to the present invention, a retriggerable monostable multivibrator is employed to delay an input pulse signal by one period thereof or less. In such a circuit construction, only one lock-in point exists in the frequency discrimination characteristic.

DESCRIPTION OF THE PREFERRED EMBODIMENTS

Now, explanation will be made of embodiments of the present invention by reference to the drawings.

Figure 5:
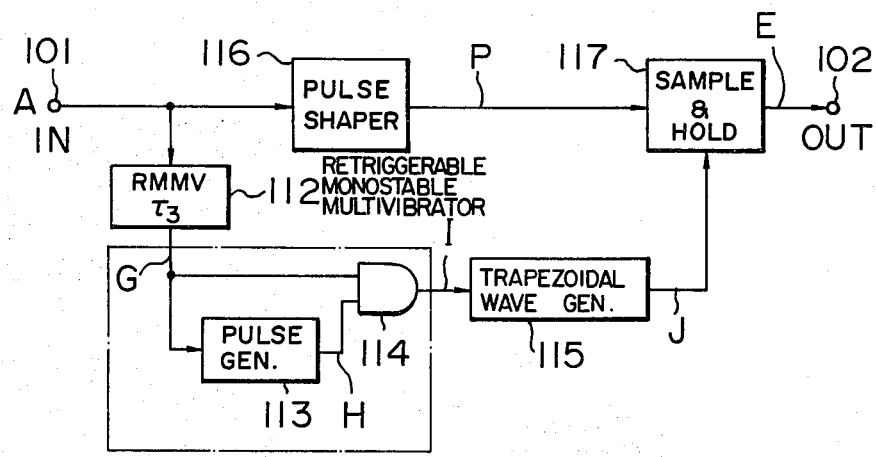
FIG. 5 is a block diagram showing an embodiment of a frequency discrimination circuit according to the present invention.

FIG. 5 shows an embodiment of a frequency discrimination circuit according to the present invention. In FIG. 5, reference numeral 112 designates a retriggerable monostable multivibrator (hereinafter referred to as "RMMV") having a time consant $\tau_3$, 113 a pulse generator 114 an AND gate, 115 a trapezoidal wave generator, 116 a pulse shaper, and 117 a sample-and-hold circuit. Reference numerals 101 and 102 designate input and output terminals, respectively, as in FIG. 2. The trapezoidal wave generator 115, pulse shaper 116 and sample-and-hold circuit 117 may have the same circuit construction as the circuits 105, 106 and 107 shown in FIG. 2, respectively.

Figure 6:
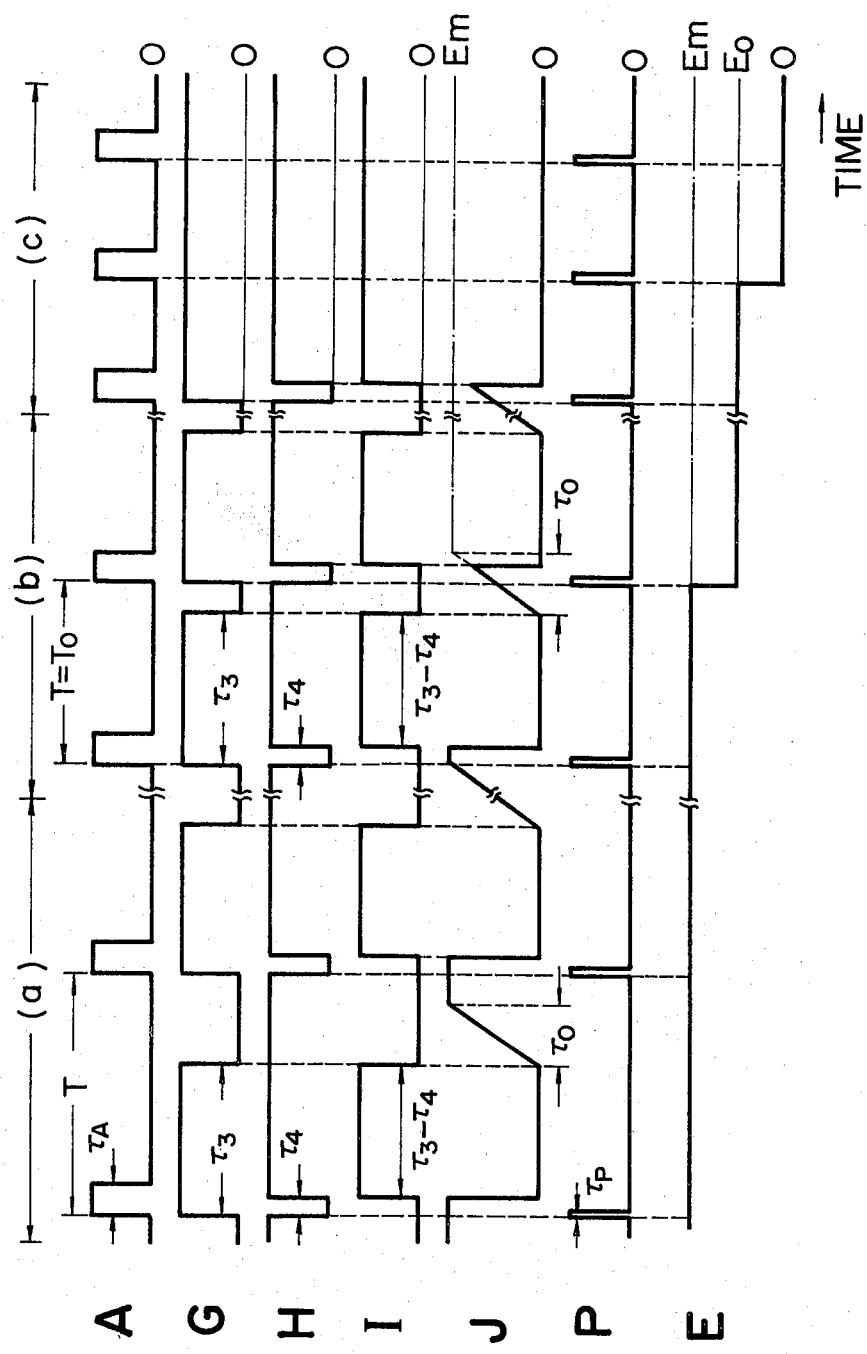
FIG. 6 is a timing chart for explaining the operation of the embodiment shown in FIG. 5.

Next, the operation of the embodiment shown in FIG. 5 will be explained below in detail using a waveform chart shown in FIG. 6. Referring to FIG. 6, in a range (a) of time, the period T of the input pulse signal A is much larger than a predetermined $T_0$ (that is, $T>>T_0$), and the frequency of the input pulse signal A does not reach a predetermined frequency range. The period $T_0$ corresponds to a predetermined target speed. In a range (b) of time shown in FIG. 6, the frequency of the input pulse signal A lies within the predetermined frequency range where the error voltage is varied with the frequency of the input pulse signal A, that is, the frequency of the input pulse signal A corresponds to the center of a controllable speed range and the neighborhood thereof. In a range (c) of time, the frequency of the input pulse signal A exceeds the predetermined frequency range (that is, $T \ll T_0$), and the error voltage is maintained at a low level.

Referring back to FIG. 5, the input pulse signal A applied to the input terminal 101 triggers RMMV 112. RMMV 112 generates a first square wave signal G which is synchronized with the leading edge of the input pulse signal A and has a pulse width $\tau_3$, as shown in FIG. 6. In other words, the time constant $\tau_3$ of RMMV 112 is made equal to the sum of the time constants $\tau_1$ and $\tau_2$ shown in FIGS. 2 and 3. When the time constant $\tau_3$ is set, it is to be taken into consideration that the time constant $\tau_1$ is made longer than a frequency detection period in order to apply a high voltage to a motor when the motor is started and to thereby improve the starting response of the motor.

As is apparent from the waveforms A and G shown in FIG. 6, even in the range (c) of time when the period of the pulse signal A applied to RMMV 112 is shorter than the time constant $\tau_3$ of RMMV 112, RMMV 112 is triggered successively by the input pulse signal A and therefore generates a continuous output. RMMV 112 may be replaced by retriggerable circuit means having the same function as RMMV 112, for example, a TTL IC having a trade name of "HD 74123" and manufactured by Hitachi Ltd.

The first square wave signal G from RMMV 112 is applied to the pulse generator 113, which generates a pulse train H synchronized with the leading edges of the square wave signal G and having a predetermined pulse width $\tau_4$. The pulse train H is applied as one of inputs to the AND gate 114. The pulse width $\tau_4$ is provided to cause the sample-and-hold circuit 117 to ensure the sampling operation, and therefore is selected so as to be a little longer than the pulse width of a sampling pulse P. The square wave signal G is applied as the other input to the AND gate 114. Accordingly, the AND gate 114 outputs a second square wave signal I whose leading edge is delayed from the leading edge of the first square wave signal G by the pulse width $\tau_4$ of the pulse train H. A monostable multivibrator having a time constant $\tau_4$ may be used as the pulse generator 113.

The second square wave signal I from the AND gate 114 is applied to the trapezoidal wave generator 115, which is made up of a bootstrap circuit as an integrator and others and generates a trapezoidal wave signal J. In more detail, as is apparent from the waveforms I and J shown in FIG. 6, the trapezoidal wave signal J, that is, the output voltage of the trapezoidal wave generator 115 is equal to zero during the second square wave signal I is kept in a positive level. When the second square wave signal I is brought to the level of "0", the output voltage J begins to increase in synchronism with the trailing edge of the signal I, is increased linearly with time, reaches a maximum value $E_m$ after a predetermined period $\tau_0$ (which may be set in a similar manner to FIG. 2), and is maintained at the maximum value $E_m$ till the signal I is again brought to the positive level.

Figure 2:
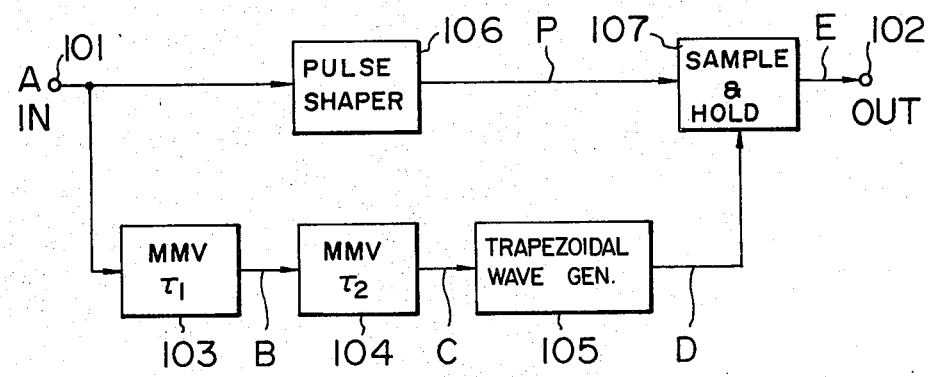
FIG. 2 is a block diagram showing a conventional frequency discrimination circuit.
Figure 3:
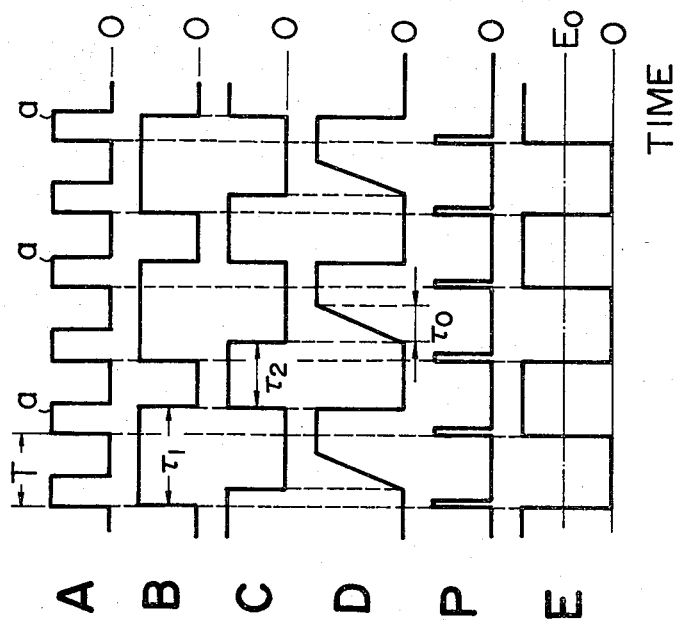
FIGS. 3 and 4 are timing charts for explaining the operation of the frequency discrimination circuit shown in FIG. 2.
Figure 4:
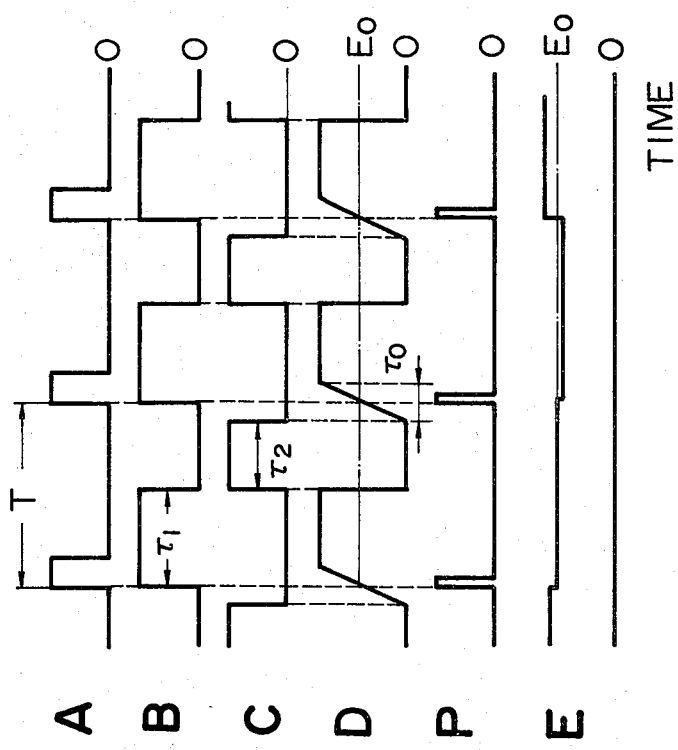

Similarly to the circuit shown in FIG. 2, the trapezoidal wave signal J from the trapezoidal wave generator 115 is applied to the sample-and-hold circuit 117 to be sampled by a sampling pulse P which is formed by shaping the input pulse signal A by the pulse shaper 116. The sampled value is held during a sampling period to generate an error voltage E on the output terminal 102.

Now, let us consider the case where the period T of the input pulse signal A is longer than a predetermined range including a period $T_0$ corresponding to a target speed, as in the range (a) of time shown in FIG. 6.

In this case, the period T of the input pulse signal A is longer than the sum of the time constant $\tau_3$ of RMMV 112 and the period $\tau_0$ given by the trapezoidal wave generator 115, that is, $T > \tau_3 + \tau_0$. Accordingly, as is apparent from the waveforms J and P in the range (a) shown in FIG. 6, the trapezoidal wave signal J is sampled always at the maximum value part thereof by the sampling pulse P, which is synchronized with the leading edge of the input pulse signal A. In this case, therefore, the error voltage $E_0$ is equal to the maximum value $E_m$ of the trapezoidal wave signal J.

Next, in the case where the period T of the input pulse signal A is in the neighborhood of the predetermined period $T_0$, as in the range (b) of time shown in FIG. 6, the trapezoidal wave signal J is sampled at the period $\tau_0$ thereof by the sampling pulse P. Accordingly, the error voltage E has a value within a range from zero to the maximum value $E_m$ and is varied with the period T of the input pulse signal A. When the period $T_0$ is made equal to the sum of the time constant $\tau_3$ and one half the period $\tau_0$, that is, when $T_0 = \tau_3 + \tau_0/2$, the error voltage E becomes nearly equal to one half the maximum value $E_m$ (i.e., a voltage $E_0$) at $T = T_0$.

In this case, the periods $\tau_3$ and $\tau_0$ are determined taking into consideration the following facts: the frequency discrimination sensitivity depends upon the angle of inclination of waveform at the period $\tau_0$, and it is desirable to obtain a high error voltage since succeeding amplifying stages can be simplified.

Finally, in the case where the period T of the input pulse signal A is shorter than the predetermined range including the period $T_0$, as in the range (c) of time shown in FIG. 6, the input pulse signal A is applied to RMMV 112 prior to the lapse of the period $\tau_3$ from the application of the preceding input pulse A, and RMMV 112 is thereby retriggered. As a result, the first square wave signal G outputted from RMMV 112 becomes a positive d.c. voltage.

Accordingly, the second square wave signal I outputted from the AND gate 114 also becomes a positive d.c. voltage. Since the positive d.c. voltage is applied to the trapezoidal wave generator 115, the trapezoidal wave signal J outputted from the generator 115 is kept in the level of 37 0". Accordingly, the sampled value in the sample-and-hold circuit 117 is equal to zero, and therefore the error voltage becomes equal to zero.

The foregoing explanation may be summarized as follows:

(1) when the frequency of the input pulse signal A is lower than a predetermined frequency range, that is, when $T \geq \tau_3 + \tau_0$, the error voltage E is equal to the maximum value $E_m$ (i.e., $E = E_m$);

(2) when the frequency of the input pulse signal A lies within the predetermined frequency range, that is, when $\tau_3 \leq T \leq \tau_3 + \tau_0$, the error voltage E is given by a relation $0 \leq E \leq E_m$; and (3) when the frequency of the input pulse signal A exceeds the predetermined frequency range, that is, when $T \leq \tau_3$, the error voltage E is equal to zero (i.e., $E = 0$).

As is apparent from the waveform chart shown in FIG. 6, in the frequency discrimination circuit according to the present invention, the timing for judging the period T of the input pulse signal A is determined only by the time constant $\tau_3$ of RMMV 112, and moreover, even if the frequency of the input pulse signal A is unusually increased for some reason, there is no danger that a plurality of stable states appear in the frequency discriminating operation, since RMMV 112 has no frequency dividing effect.

The conventional frequency discrimination circuit shown in FIG. 2 includes a plurality of monostable multivibrators whose operating condition is apt to be affected by a change in ambient temperature and by variations in supply voltage. On the other hand, the frequency discrimination circuit according to the present invention includes only one monostable multivibrator. Therefore, when incorporated in a servo control system for controlling the speed of revolution of a rotating body, the frequency discrimination circuit according to the present invention exhibits a remarkable effect in that the speed of revolution is more stabilized, and moreover does not produce any false lock-in point.

In the embodiment shown in FIG. 5, gate means for generating the second square wave signal I are made up of the pulse generator 113 for surely performing the sampling operation and the AND gate 114. However, the frequency discrimination circuit according to the present invention is not limited to such a circuit configuration, but the gate means can be constituted by other logical gates.

Figure 7:
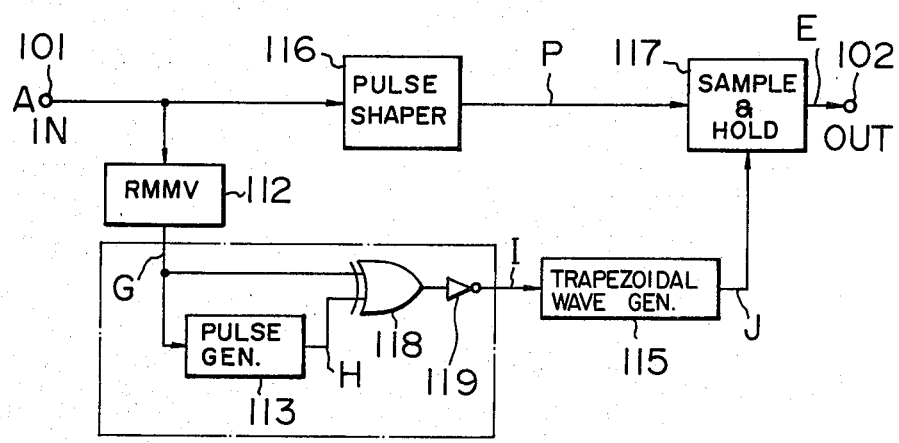
FIGS. 7, 8 and 9 are block diagrams for showing three different embodiments of a frequency discrimination circuit according to the present invention.

FIG. 7 shows another embodiment of a frequency discrimination circuit according to the present invention, which includes an EXCLUSIVE-OR gate.

The embodiment shown in FIG. 7 has the same circuit construction as that shown in FIG. 5, except that an EXCLUSIVE-OR gate 118 and an inverter 119 are used in place of the AND gate 114, and therefore the waveform, operation and effect of each of the signals G, H and I are the same in the above two embodiments. Accordingly, further explanation of the embodiment shown in FIG. 7 is omitted.

As is apparent from the relation among the waveforms A, G and H shown in FIG. 6, the pulse train H is not always required to be produced from the first square wave signal G but may be produced directly from the input pulse signal A.

Figure 8:
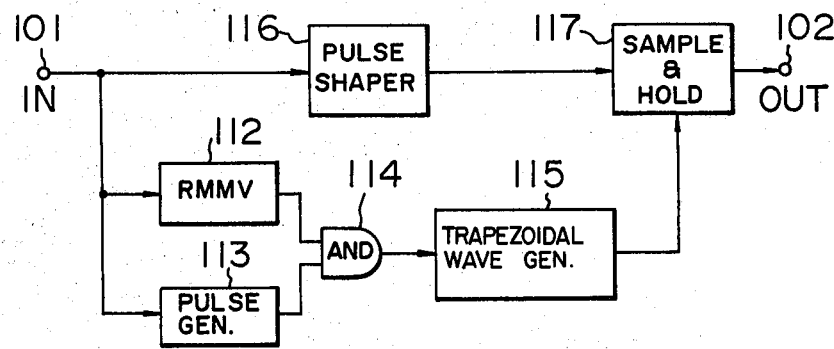

FIG. 8 shows a further embodiment of a frequency discrimination circuit according to the present invention, which is formed based upon the above conception.

Referring to FIG. 8, the input side of tht pulse generator 113 is connected directly to the input terminal 101, and therefore the pulse train H is formed from the input pulse signal A. Other circuit parts as well as the waveform, operation and effect of each of the signals G, H and I are the same in the embodiments shown respectively in FIGS. 5 and 8.

Figure 9:
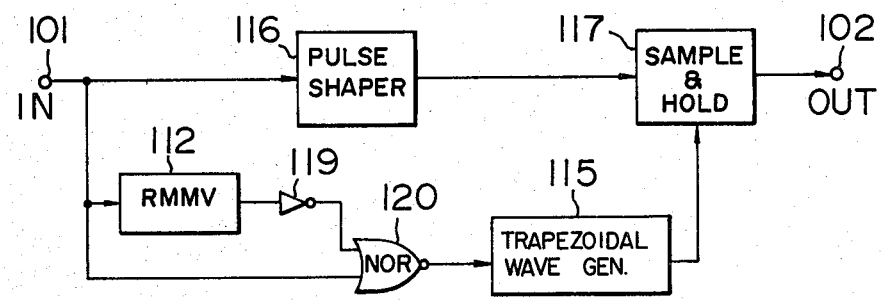

Further, as is apparent from the explanation of the embodiment shown in FIG. 5 and from the waveform chart shown in FIG. 6, the pulse width $\tau_4$ of the pulse train H, which is used only to surely perform the sampling operation, has no connection with the frequency discrimination characteristic of the embodiments. Fundamentally speaking, the pulse train H is required only to meet the condition that the pulse width $\tau_4$ thereof is longer than the pulse width $\tau_P$ of the sampling pulse P and is shorter than the pulse width $\tau_3$ of the first square wave signal G (that is, $\tau_P < \tau_4 < \tau_3$). When the pulse width $\tau_A$ of the input pulse signal A meets the above-mentioned condition, that is, when $\tau_P < \tau_A < \tau_3$, the pulse generator 113 can be omitted to simplify the circuit construction of the frequency discrimination circuit. In other words, when the pulse width $\tau_A$ is longer than the pulse width $\tau_P$, the pulse width $\tau_A$ can be used in place of the pulse width $\tau_4$ in the waveform chart shown in FIG. 6. For example, in the embodiment shown in FIG. 8, the pulse generator 113 is removed, and the lower input of the AND gate 114 is connected to the input terminal 101 through an inverter. Alternatively, there may be formed such a circuit as shown in FIG. 9. FIG. 9 shows still another embodiment of a frequency discrimination circuit according to the present invention. Referring to FIG. 9, an inverter 119 and an NOR gate 120 are provided in place of the AND gate 114 in the embodiment shown in FIG. 8, the lower input of the NOR gate 120 is connected directly to the input terminal 101, and thus the pulse generator 113 is omitted.

It is needless to say that the embodiment shown in FIG. 9 produces the same effect as that shown in FIG. 5.

Figure 1:
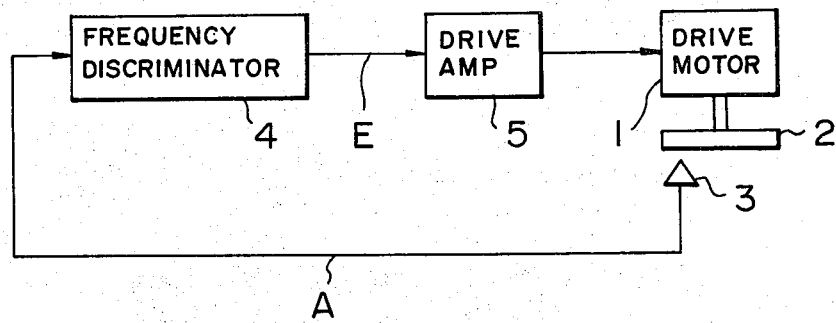
FIG. 1 is a block diagram showing a servo control system employed in revolution-speed control devices.

A frequency discrimination circuit according to the present invention is not only used in the servo control system shown in FIG. 1, but also is applicable to various cases where it is required to detect the frequency change of input signal and deliver an analog detection signal, for example, a frequency measuring apparatus and a device for detecting accurately variations in frequency to display an alarm.

It is to be understood that RMMV 112 may be formed of a digital circuit having the same function as a retriggerable monostable multivibrator, for example, a circuit including a counter which begins to count predetermined clock pulses in response to the input pulse signal A and performs the counting operation for a predetermined time.

I claim:

1. A frequency discrimination circuit for generating an output signal having a value proportional to a frequency of an input pulse signal in a predetermined range of frequencies to be detected, comprising:
    (a) means including a retriggerable monostable multivibrator for generating a first square wave signal of a predetermined pulse width in synchronism with said input pulse signal except when said retriggerable monostable multivibrator is retriggered, said input pulse signal being applied as a triggering input to said retriggerable monostable multivibrator;
    (b) gate means including a gate circuit said gate circuit receiving said first square wave signal and a delaying pulse as first and second inputs, respectively, said delaying pulse providing a delay time of at least a pulse width of a sampling pulse sufficient to perform a sampling and holding operation, said gate means generating a second square wave signal in response to said first square wave signal, said second square wave signal being synchronized with said first square wave signal except that a leading edge of said second square wave signal being delayed by a pulse width said delaying pulse as compared with said leading edge of said first square wave signal;
    (c) a trapezoidal wave generator supplied with said second square wave signal for generating a signal, said signal being maintained at a minimum value during said first square wave signal is present and being varied monotonically with time at a period when said first square wave signal is absent; and
    (d) a sample-and-hold circuit receiving said signal from said trapezoidal wave generator and said sampling pulse as its input to be sampled and its sampling input, respectively, for outputting a frequency discrimination output signal corresponding to said input pulse signal, said sampling pulse being generated in synchronism with the application of each input pulse signal.

2. A frequency discrimination circuit according to claim 1, wherein a circuit for generating said delaying pulse is connected to a second input terminal of said gate means, and generates said delaying pulse on the basis of either one of said input pulse signal and said first square wave signal.

3. A frequency discrimination circuit according to claim 1, wherein a second input terminal of said gate means is supplied with said input pulse signal, and a pulse width of said input pulse signal is greater than a pulse width of said sampling input and is smaller than a pulse width of said first square wave signal.

4. A frequency discrimination circuit for generating an output signal which has an upper saturation value or a lower saturation value, when an input pulse signal is out of a predetermined frequency detection range and has a value being proportional to the frequency of the input pulse signal and lying between said upper and lower saturation values when it is within said detection range, comprising:
(a) retriggerable monostable multivibrator means for generating a first square wave signal of a predetermined pulse width in synchronism with said input pulse signal except for the case where said retriggerable monostable multivibrator means is retriggered, said input pulse signal being applied as a triggering input to said retriggerable monostable multivibrator means;
(b) gate means including a gate circuit for generating a second square wave signal, said first square wave signal being applied as a first input to said gate circuit, said gate circuit receiving as a second input one of said input pulse signal, a signal obtained by subjecting said input pulse signal to waveform conversion, and a signal obtained by subjecting said first square wave signal to waveform conversion, a leading edge of said second square wave signal being delayed by a predetermined time from a corresponding leading edge of said first square wave signal, a trailing edge of said second square wave signal being synchronized with a corresponding trailing edge of said first square wave signal;
(c) a trapezoidal wave generator supplied with said second square wave signal for generating a signal, said signal being maintained at a minimum value during said second square wave signal is kept in a high level and being varied monotonically with time at a period when said second square wave signal is kept in a low level; and
(d) a sample-and-hold circuit receiving said signal from said trapezoidal wave generator as its input to be sampled and a sampling pulse as its sampling input, for generating a frequency discrimination output signal, said sampling pulse being generated in synchronism with a leading edge of said input pulse signal.

5. A frequency discrimination circuit according to claim 4, wherein said input pulse signal is a signal indicating a speed of revolution of a rotating body required to have a constant speed of revolution, and said frequency discrimination output signal from said sample-and-hold circuit is a signal for correcting said speed of revolution of said rotating body.

6. In a speed control device including a speed detector for detecting a speed of revolution of a rotating body driven by a motor to generate an input pulse signal having a frequency proportional to said speed of revolution, a frequency discrimination circuit supplied with said input pulse signal for discriminating said proportional frequency from a predetermined frequency corresponding to a predetermined speed of revolution to generate as a discrimination output an error voltage corresponding to a deviation of said proportional frequency from said predetermined frequency, and a motor driving amplifier supplied with said error voltage for changing a revolution speed of said motor so as to maintain said revolution speed of said rotating body at a predetermined value, the improvement wherein said frequency discrimination circuit comprises:
(a) a trapezoidal wave generator for generating a trapezoidal wave signal, said trapezoidal wave signal including a part having a constant inclination, said part beginning at a time delayed from said input pulse signal by about one period of said input pulse signal;
(b) a sample-and-hold circuit receiving said trapezoidal wave signal from said trapezoidal wave generator as its input to be sampled and a sampling pulse as its sampling input, for outputting a frequency discrimination output signal, said sampling pulse being generated in synchronism with the application of each input pulse signal, said sampling pulse having a relatively small width;
(c) a single retriggerable monostable multivibrator receiving said input pulse signal as a triggering input, for generating a first square wave signal having a predetermined pulse width in synchronism with said input pulse signal except when said retriggerable monostable multivibrator is retriggered; and
(d) AND gate means receiving said first square wave signal and a pulse train as first and second inputs, respectively, for generating a second square wave signal, said pulse train being generated in synchronism with the application of each input pulse signal, a pulse width of said pulse train being at least greater than the width of said sampling pulse and being smaller than said predetermined pulse width, said second square wave signal rising at a time delayed from a leading edge of said first square wave signal by a predetermined period and falling in synchronism with a trailing edge of said first square wave signal, said second square wave signal being applied to said trapezoidal wave generator to cause said trapezoidal wave generator to generate said trapezoidal wave signal at a period when said second square wave signal is kept in a low level, thereby generating said frequency discrimination output signal having a value proportional to said frequency of said input pulse signal in a predetermined range of frequencies to be detected.

* * * * *